United States Patent
Farsch et al.

(10) Patent No.: US 12,078,666 B2
(45) Date of Patent: Sep. 3, 2024

(54) MULTI-CHANNEL CAPACITANCE SENSING MEASUREMENT CIRCUIT

(71) Applicant: IEE INTERNATIONAL ELECTRONICS & ENGINEERING S.A., Echternach (LU)

(72) Inventors: Bernd Farsch, Schweich (DE); Attila Konfar, Oberbillig (DE); Christian Urig, Püttlingen (DE); Christoph Wendt, Trier (DE); Laurent Lamesch, Reichlange (LU)

(73) Assignee: IEE INTERNATIONAL ELECTRONICS & ENGINEERING S.A., Echternach (LU)

( * ) Notice: Subject to any disclaimer, the term of this patent is extended or adjusted under 35 U.S.C. 154(b) by 245 days.

(21) Appl. No.: 17/602,773

(22) PCT Filed: Apr. 7, 2020

(86) PCT No.: PCT/EP2020/059828
§ 371 (c)(1),
(2) Date: Oct. 10, 2021

(87) PCT Pub. No.: WO2020/207989
PCT Pub. Date: Oct. 15, 2020

(65) Prior Publication Data
US 2022/0155355 A1 May 19, 2022

(30) Foreign Application Priority Data
Apr. 10, 2019 (LU) .......................................... 101178
May 29, 2019 (LU) .......................................... 101255

(51) Int. Cl.
*G01R 27/26* (2006.01)
*G01R 19/00* (2006.01)

(52) U.S. Cl.
CPC ..... *G01R 27/2605* (2013.01); *G01R 19/0092* (2013.01)

(58) Field of Classification Search
CPC . G01R 27/26; G01R 27/2605; G01R 19/0092
(Continued)

(56) References Cited

U.S. PATENT DOCUMENTS 5,281,860 A * 1/1994 Krenik ................ G11C 27/026
327/91
6,161,070 A * 12/2000 Jinno ................ B60R 21/01532
701/45
(Continued)

FOREIGN PATENT DOCUMENTS

CN 1759025 A * 4/2006 ............. B60R 21/00
CN 101896825 B * 4/2015 ......... G01R 27/2605
(Continued)

OTHER PUBLICATIONS

International Search Report corresponding to International Application No. PCT/EP2020/059828, dated Jun. 3, 2020, 4 pages.
(Continued)

*Primary Examiner* — Dominic E Hawkins
(74) *Attorney, Agent, or Firm* — Reising Ethington P.C.

(57) ABSTRACT

A capacitance measurement circuit for determining complex electric currents in a multi-channel capacitive sensing device includes a first sensing circuit for selectively connecting one of a plurality of sense electrodes to a common sense node and for connecting a corresponding guard electrode of the sense electrode to a common guard node, and at least a second sensing circuit. A measurement signal voltage source provides an alternating measurement voltage to the common guard node in a remotely controllable manner. A diagnostic signal voltage source provides an alternating diagnostic voltage to the common guard node in a remotely control-
(Continued)

lable manner. A current measurement circuit is connected with a signal input port to the common sense node and with a reference input port to the output port of the measurement signal voltage source.

15 Claims, 2 Drawing Sheets

(58) Field of Classification Search
USPC .................................. 324/519, 658, 686
See application file for complete search history.

(56) References Cited

U.S. PATENT DOCUMENTS

| | | | | |
|---|---|---|---|---|
| 6,949,937 | B2* | 9/2005 | Knoedgen | G01D 5/241 |
| | | | | 324/678 |
| 8,237,456 | B2* | 8/2012 | Dubery | G01D 15/00 |
| | | | | 73/304 C |
| 8,339,148 | B2* | 12/2012 | Ahn | G01D 5/24 |
| | | | | 324/519 |
| 8,354,936 | B2* | 1/2013 | Ootaka | B60N 2/002 |
| | | | | 340/552 |
| 9,531,380 | B2* | 12/2016 | Dubery | G01D 15/00 |
| 9,857,394 | B2* | 1/2018 | Gao | G01R 27/2605 |
| 10,065,590 | B2* | 9/2018 | Lamesch | H03K 17/955 |
| 10,108,300 | B2* | 10/2018 | Tang | G06F 3/04182 |
| 10,230,367 | B2* | 3/2019 | Kim | G06F 3/0418 |
| 10,372,283 | B2* | 8/2019 | Suwald | G06F 3/04166 |
| 10,408,862 | B2* | 9/2019 | Gao | G01R 15/002 |
| 10,511,305 | B2* | 12/2019 | Dubery | G01R 29/0878 |
| 10,911,046 | B2* | 2/2021 | Dubery | G01D 15/00 |
| 11,378,420 | B2* | 7/2022 | Althaus | B62D 1/046 |
| 2005/0134292 | A1* | 6/2005 | Knoedgen | G01D 5/241 |
| | | | | 324/658 |
| 2005/0253712 | A1* | 11/2005 | Kimura | B60R 21/01532 |
| | | | | 340/562 |
| 2007/0029768 | A1* | 2/2007 | Clos | B60R 21/01532 |
| | | | | 340/573.4 |
| 2009/0167720 | A1* | 7/2009 | Geaghan | G06F 3/0416 |
| | | | | 345/174 |
| 2010/0033196 | A1* | 2/2010 | Hayakawa | G01L 1/142 |
| | | | | 324/686 |
| 2010/0188106 | A1* | 7/2010 | Ahn | G01D 5/24 |
| | | | | 324/683 |
| 2010/0219846 | A1* | 9/2010 | Dubery | G01D 5/24 |
| | | | | 324/686 |
| 2010/0315099 | A1* | 12/2010 | Ootaka | B60R 21/01532 |
| | | | | 324/679 |
| 2013/0002269 | A1* | 1/2013 | Dubery | G01R 29/0878 |
| | | | | 324/686 |
| 2015/0097583 | A1* | 4/2015 | Gao | G01R 27/2605 |
| | | | | 324/679 |
| 2017/0060342 | A1* | 3/2017 | Tang | G06F 3/0418 |
| 2017/0134022 | A1* | 5/2017 | Kim | H03K 17/955 |
| 2017/0170825 | A1* | 6/2017 | Dubery | G01D 21/00 |
| 2017/0305376 | A1* | 10/2017 | Lamesch | H03K 17/955 |
| 2018/0120355 | A1* | 5/2018 | Gao | G01R 1/30 |
| 2019/0047502 | A1* | 2/2019 | Lamesch | B60R 21/01532 |
| 2020/0220542 | A1* | 7/2020 | Dubery | G01D 1/00 |
| 2020/0379056 | A1* | 12/2020 | Lamesch | H03K 17/955 |
| 2021/0013882 | A1* | 1/2021 | Lamesch | H03K 17/955 |
| 2021/0356298 | A1* | 11/2021 | Althaus | G01D 5/241 |
| 2022/0155355 | A1* | 5/2022 | Farsch | G01R 27/2605 |
| 2022/0200594 | A1* | 6/2022 | Faber | B62D 1/06 |
| 2022/0376691 | A1* | 11/2022 | Faber | B62D 1/046 |
| 2023/0297188 | A1* | 9/2023 | Rouaissia | G06F 3/044 |
| | | | | 345/174 |

FOREIGN PATENT DOCUMENTS

| | | | | |
|---|---|---|---|---|
| CN | 113711064 A | * | 11/2021 | ......... G01R 19/0092 |
| EP | 1548409 A1 | * | 6/2005 | ............ G01D 5/241 |
| EP | 3144640 A1 | * | 3/2017 | |
| EP | 3168721 A2 | * | 5/2017 | ......... G01R 27/2605 |
| LU | 101255 B1 | * | 11/2020 | ......... G01R 19/0092 |
| WO | WO-2009011473 A1 | * | 1/2009 | ............... G01D 5/24 |
| WO | WO-2015051096 A1 | * | 4/2015 | ............... G01D 5/24 |
| WO | WO-2016055667 A1 | * | 4/2016 | ....... B60R 21/01532 |
| WO | WO-2016150594 A1 | * | 9/2016 | ............ B60N 2/002 |
| WO | WO-2017129552 A1 | * | 8/2017 | ............ B60N 2/002 |
| WO | WO-2019057843 A1 | * | 3/2019 | |
| WO | WO-2019149901 A1 | * | 8/2019 | ....... B60R 21/01532 |
| WO | WO-2019154914 A1 | * | 8/2019 | ............... G01D 5/24 |
| WO | WO-2020114858 A1 | * | 6/2020 | ............ B60N 2/002 |
| WO | WO-2020207989 A1 | * | 10/2020 | ......... G01R 19/0092 |
| WO | WO-2020208043 A1 | * | 10/2020 | ........... B60R 21/015 |

OTHER PUBLICATIONS

Written Opinion corresponding to International Application No. PCT/EP2020/059828, dated Jun. 3, 2020, 9 pages.

Joshua Smith et al., "Electric Field Sensing For Graphical Interfaces", IEEE Computer Graphics and Applications, Computer Graphics and Applications, vol. 18, No. 3, dated May 1, 1998, pp. 54-60.

* cited by examiner

MULTI-CHANNEL CAPACITANCE SENSING MEASUREMENT CIRCUIT

TECHNICAL FIELD

The invention relates to a multi-channel capacitance sensing measurement circuit for determining complex electric currents in a multi-channel capacitive sensor device having a plurality of guard-sense capacitive sensors to be operated in loading mode, a multi-channel capacitive sensor device having such measurement circuit, and a method of operating such capacitive multi-channel sensing device for diagnosis of sense electrodes being paired with corresponding guard electrodes.

BACKGROUND

Capacitive sensors and capacitive measurement and/or detection devices employing capacitive sensors have a wide range of applications, and are among others used for the detection of the presence and/or the position of a conductive body or body portion in the vicinity of an antenna electrode. As used herein, the term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

In the field of automotive vehicle sensor application it is known to employ capacitive sensors in vehicle seat occupant sensing systems for providing input to Automatic Driver Assistance Systems (ADAS), for instance for the purpose of a seat belt reminder (SBR) system or an activation control for an auxiliary restraint system (ARS). Sensed signals can serve as a basis for making decisions by an ADAS, for instance for a decision to deploy an air bag system to a specific vehicle seat or not.

Capacitive occupant sensing systems have been proposed in great variety, e.g. for controlling the deployment of one or more airbags, such as e.g. a driver airbag, a passenger airbag and/or a side airbag. U.S. Pat. No. 6,161,070, to Jinno et al., relates to a passenger detection system including a single antenna electrode mounted on a surface of a passenger seat in an automobile. An oscillator applies on oscillating voltage signal to the antenna electrode, whereby a minute electric field is produced around the antenna electrode. Jinno proposes detecting the presence or absence of a passenger in the seat based on the amplitude and the phase of the current flowing to the antenna electrode.

Another example for the use of capacitive sensors in an automotive vehicle application is the so-called Hands off Detection (HoD) system, in which one or more sensors provide information about whether a driver has his hands on a steering wheel of a vehicle or not. This information can be transferred to an ADAS such as an Adaptive Cruise Control (ACC), which, based on the provided sensor signal, can alert the driver and remind him or her to take control of the steering wheel again. In particular, such HoD systems can be used in support to fulfill a requirement of the Vienna convention that the driver must remain in control of the vehicle at all times. HoD systems may as well be employed in a parking assistance system or an ADAS that is configured for evaluating a driver activity at high speed.

In some (so-called "loading mode") capacitive sensors, the at least one antenna electrode serve at the same time as sensing electrode. In this case, a measurement circuit determines a current flowing into the at least one antenna electrode in response to an oscillating voltage being applied to them. The relationship of voltage to current yields the complex impedance between the at least one antenna electrode and ground potential. In an alternative version of capacitive sensors ("coupling mode" capacitive sensors), the transmitting antenna electrode(s) and the sensing electrode(s) are separate from one another. In this case, the measurement circuit determines a current or voltage that is induced in the sensing electrode when at least one transmitting antenna electrode is being operated.

Different capacitive sensing mechanisms are for instance explained in the technical paper entitled "*Electric Field Sensing for Graphical Interfaces*" by J. R. Smith et al., published in IEEE Computer Graphics and Applications, 18(3): 54-60, 1998, which shall hereby be incorporated by reference in its entirety with effect for the jurisdictions permitting incorporation by reference.

The paper describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmitting electrode, building up an electric field to a receiving electrode, and the displacement current induced at the receiving electrode is measured. The measured displacement current depends on the body being sensed. In the "transmit mode", the transmit electrode is put in contact with the user's body, which then becomes a transmitter relative to a receiver, either by direct electrical connection or via capacitive coupling.

The capacitive coupling strength may, for instance, be determined by applying an alternating voltage signal to an antenna electrode and by measuring the current flowing from that antenna electrode either towards ground (in the loading mode) or into a second antenna electrode (in the coupling mode). This current may be measured by a transimpedance amplifier (TIA), which is connected to the sensing electrode and which converts the current flowing into the sensing electrode into a voltage proportional to this current.

Some capacitive sensors are designed as sense-only capacitive sensors having a single sense electrode. Also, quite often capacitive sensors are used that comprise a sense electrode and a so-called "guard electrode" that are proximally arranged and mutually galvanically insulated from each other. This technique of "guarding" is well known in the art and is frequently used for intentionally masking, and thus shaping, a sensitivity regime of a capacitive sensor. To this end, the guard electrode is kept at the same electric AC potential as the sense electrode. As a result, a space between the sense electrode and the guard electrode is free of an electric field, and the guard-sense capacitive sensor is insensitive in a direction between the sense electrode and the guard electrode.

By way of example, patent document U.S. Pat. No. 8,354,936 B2 describes a capacitive passenger detector for a vehicle. The capacitive passenger detector includes a main electrode, a sub-electrode and a guard electrode. The main electrode and the sub-electrode are separated apart from each other, and disposed in a seat of a vehicle. The guard electrode is disposed between the main electrode and a body of the vehicle, and separated apart from the main electrode. A sensitive characteristic measurement unit is configured for applying an alternating voltage signal to the main electrode, the sub-electrode and the guard electrode selectively or totally and for converting a current generated in the main electrode, the sub-electrode and the guard electrode to a voltage, respectively. The capacitive passenger detector further comprises a controller that defines a current flowing through the guard electrode to be a reference current when a voltage of the main electrode and a voltage of the guard electrode have the same potential. The controller defines a current flowing direction of the current flowing through the guard electrode to be a negative direction when the voltage of the main electrode is higher than the voltage of the guard electrode. The controller defines the current flowing direction of the current flowing through the guard electrode to be a positive direction when the voltage of the main electrode is lower than the voltage of the guard electrode. The controller corrects the voltage of the main electrode based on the current flowing through the guard electrode so that a corrected voltage of the main electrode is set to be a passenger determination data. Even when a potential difference is generated between the main electrode and the guard electrode, the controller detects the capacitance of the passenger correctly.

Capacitive sensing systems which are used in the control of airbag systems or other safety-related applications may be considered as safety-relevant system components. It may thus be necessary to monitor the good functioning of the different components of the sensor (sensing electrode and/or guard electrode) in order to rule out a false reading by the capacitive occupancy or proximity detection system.

Specifically in Hands off Detection (HoD) systems, a guard electrode is often employed for shielding one or more sense electrodes from inner parts of a vehicle steering wheel. Any damage of an electric connection of the guard electrode to a signal-processing circuitry of a capacitive sensor system can jeopardize the reliability of measurement results of the capacitive sensor.

It has been proposed in the prior art to furnish capacitive measurement circuits with diagnostic means for detecting a capacitive sensor interruption, in particular a guard electrode interruption.

For instance, international application WO 2017/129552 A1 describes a capacitance measurement circuit for determining a sense current of a capacitive sensor with a sense electrode and a guard electrode. The capacitance measurement circuit comprises a periodic signal voltage source, a sense current measurement circuit configured for determining the sense current with reference to a reference voltage and at least one remotely controllable switch member. The configuration is such that in the first switching state, the at least one switch member electrically connects the sense current measurement circuit to the periodic measurement voltage for providing a first reference voltage, and in the second switching state, the at least one switch member electrically connects the sense current measurement circuit to a second reference voltage that is different from the first reference voltage. By intentionally changing the reference voltage used for determining the sense current by connecting the sense current measurement circuit to the second reference voltage that is different from the first reference voltage, a signal can be generated by the sense current measurement circuit that can be indicative of an electrical interruption, wherein the interruption may include any interruption of electrical connections between the respective sense and guard cabling and connecting members.

SUMMARY

It is therefore an object of the invention to provide a capacitance sensing measurement circuit of a capacitive sensing device, which facilitates diagnosing the integrity of capacitive sense-guard sensors of the capacitive sensing device and which requires as little additional hardware effort as possible. The capacitance sensing measurement circuit shall be suitable particularly for use in automotive applications, and shall be particularly suitable for multi-channel capacitive sensing devices.

In one aspect of the present invention, the object may be achieved by a capacitance measurement circuit for determining complex electric currents in a multi-channel capacitive sensing device that includes a plurality of electrically conductive sense electrodes. Each sense electrode is paired with at least one corresponding electrically conductive guard electrode. It will be noted that the at least one corresponding electrically conductive guard electrode can be a dedicated guard electrode for the sense electrode or a common guard electrode for several sense electrodes.

The capacitance measurement circuit comprises a first sensing circuit, at least a second sensing circuit, a measurement signal voltage source, a diagnostic signal voltage source, and a current measurement circuit.

The first sensing circuit serves for selectively electrically connecting one of the sense electrodes to a common sense node and for electrically connecting the corresponding guard electrode of the sense electrode to a common guard node.

The at least second sensing circuit serves for selectively electrically connecting another one of the sense electrodes to the common sense node and for electrically connecting the corresponding guard electrode of the sense electrode to the common guard node.

The measurement signal voltage source is configured for providing an alternating measurement voltage at an output port to the common guard node in a remotely controllable manner.

The diagnostic signal voltage source is configured for providing an alternating diagnostic voltage at an output port to the common guard node in a remotely controllable manner.

The current measurement circuit includes at least one measurement current-to-voltage converter that is connected with its signal input port to the common sense node and with its reference input port to the output port of the signal voltage source.

The phrase "being configured to", as used in this application, shall in particular be understood as being specifically programmed, laid out, furnished or arranged.

It is further noted herewith that the terms "first", "second", etc. are used in this application for distinction purposes only, and are not meant to indicate or anticipate a sequence or a priority in any way.

For diagnosis purposes, the proposed capacitance measurement circuit can allow to selectively connect each sense electrode to an input port of the at least one measurement current-to-voltage converter, while uninvolved sense electrodes can be kept at the electric potential of the common guard node for keeping a systematic measurement error low. A diagnosis can be carried out by measuring a complex electric diagnostics current through the connected sense electrode and the at least one corresponding guard electrode. The capacitance measurement circuit can facilitate diagnosing the integrity of capacitive sensors of a multi-channel capacitive sensing device with little additional hardware effort, in particular in terms of a number of switching members. Hardware faults such as an interruption of an electric connection in a multi-channel capacitive sensing device with a plurality of capacitive sensors can reliably be detected with virtually no compromising of a functional availability of the multi-channel capacitive sensing device.

Each pair of a sense electrode and at least one corresponding electrically conductive guard electrode of the multi-channel capacitive sensing device may form a capacitive sensor that is preferably to be operated in loading mode. As already stated above, the at least one corresponding electrically conductive guard electrode can be a dedicated guard electrode for the sense electrode or a common guard electrode for several or all sense electrodes.

Preferably, the at least one guard electrode is closely arranged to and is galvanically separated from the respective sense electrode for optimum shielding.

Preferably, the provided alternating measurement voltage and the provided alternating diagnostic voltage are formed as periodic voltage curves for simple signal generation and processing.

In preferred embodiments, the capacitance measurement circuit further includes a remotely controllable switching unit comprising a plurality of operatively coupled switching members. At least one of the switching members is installed, connected in series, in each of the sensing circuits for selectively electrically connecting the sense electrodes to the common sense node. In this way, an economic and reliable solution for selectively connecting the sense electrodes to the common sense node can be provided.

Preferably, the remotely controllable switching unit is configured to periodically switch, for each sense electrode of the plurality of electrically conductive sense electrodes, and in a manner that is coordinated among the plurality of electrically conductive sense electrodes, between a measurement switching state and a diagnostic switching state of the respective sense electrode. In this way, an automatic and consecutive execution of measurement phases and diagnostic phases can be enabled.

In preferred embodiments of the capacitance measurement circuit, at least one out of the output port of the measurement signal voltage source and the output port of the diagnostic signal voltage source has a remotely controllable signal output level. In this way, a signal output level of the measurement signal voltage source and/or a signal output level of the diagnostic signal voltage source can be set to an intended output level suitable for further saving of switching members.

In preferred embodiments of the capacitance measurement circuit, a known complex impedance or a remotely controllable switching member is connected between the output port of the diagnostic signal voltage source and the common guard node for remotely controlling a provision of the diagnostic voltage to the common guard node. In this way, a well-defined diagnostic current can be injected into a sense electrode paired and a corresponding guard electrode that are to be diagnosed.

Preferably, the at least one measurement current-to-voltage converter comprises a transimpedance amplifier (TIA). The TIA is configured to convert a current that is provided to its signal input port into an output voltage that is proportional to the provided current. The conversion is performed with reference to a reference voltage that is provided to a reference input port of the TIA. In this way, a simple further signal processing can be facilitated.

It will be appreciated that the electrically conductive guard electrodes with which the sense electrodes are paired may be dedicated guard electrodes for the sense electrodes, i.e. one separate guard electrode for each sense electrode, or a common guard electrode for several sense electrodes. In the latter case, the electrically conductive guard electrode of a plurality of sense electrodes is formed by a common electrically conductive guard electrode.

In preferred embodiments of the capacitance measurement circuit, each one of the sensing circuits comprises a remotely controllable switching member that is configured to selectively electrically connect or disconnect the respective sense electrode and, in case of individual dedicated guard electrodes for each sense electrode, the corresponding guard electrode. A systematic measurement error during a capacitance measurement of a sense electrode that is selectively electrically connected to the common sense node can be kept low by establishing a low impedance, formed by the remotely controllable switching member, in parallel to each of those sense electrodes that are paired with a corresponding guard electrode or a common guard electrode and are not selectively electrically connected to the common sense node.

The remotely controllable switching members may form part of the remotely controllable switching unit.

In another aspect of the invention, a multi-channel capacitive sensing device is provided that includes a capacitance measurement circuit as disclosed herein, a plurality of electrically conductive sense electrodes, a signal processing circuit and an electronic control unit.

Each sense electrode of the plurality of electrically conductive sense electrodes is paired with at least one corresponding electrically conductive guard electrode. The at least one corresponding electrically conductive guard electrode may be a dedicated guard electrode for the sense electrode or a common guard electrode for several sense electrodes. Each one of the sense electrodes and its at least one corresponding guard electrode are connected to one of the sensing circuits of the capacitance measurement circuit for selectively electrically connecting the sense electrode to the common sense node and for electrically connecting the at least one corresponding guard electrode to the common guard node.

The signal processing circuit is configured for receiving and further processing of output signals from the current measurement circuit. The electronic control unit is at least configured to automatically control the measurement voltage level of the measurement signal voltage source, the diagnostic voltage level of the diagnostic signal voltage source, and the selective electrical connections of the sensing circuits.

The benefits described in context with the capacitance measurement circuit disclosed herein fully apply to the multi-channel capacitive sensing device.

Preferably, the electronic control unit is formed by a microcontroller that includes a digital data memory unit, a processor unit with data access to the digital data memory unit and a possibly a control interface. Such equipped microcontrollers are commercially available nowadays in many variations and at economic prices. In this way, an automated operation of the multi-channel capacitive sensing device employing the capacitance measurement circuit disclosed herein can be enabled.

Usually, the microcontroller may include a microcontroller system clock for exact timing during automatic operation of the multi-channel capacitive sensing device.

Preferably, the control interface is designed as a CAN (Controller Area Network) interface, which has the advantage of being compatible to existing automotive standards.

The term "automotive", as used in this patent application, shall particularly be understood as being suitable for use in vehicles including passenger cars, trucks, semi-trailer trucks and buses. The term "vehicle", as used in this application, shall particularly be understood to encompass passenger cars, trucks, semi-trailer trucks and buses.

In preferred embodiments of the capacitance measurement circuit, the remotely controllable switching unit forms part of the electronic control unit. In this way, short electrical switching pathways can be achieved, which are less susceptible to electromagnetic interference.

Preferably, the signal processing circuit or the electronic control unit is configured to generate an output signal that is indicative of a hardware fault if the magnitude of a determined diagnostic current flowing through one of the sense electrodes and the corresponding guard electrode is different from a predetermined nominal value outside predefined tolerance margins. In this way, a fast and reliable detection of hardware faults can be reported for instance to higher-rank electronic control units for further action.

In yet another aspect of the invention, a method of operating the multi-channel capacitive sensing device disclosed herein for diagnosis of sense electrodes being paired with corresponding guard electrodes or a common guard electrode is provided.

The method comprises at least the following steps:
electrically disconnect the output port of measurement signal voltage source from the common guard node,
control the measurement signal voltage source to set measurement voltage level to zero,
control the diagnostic signal voltage source to set diagnostic voltage level to a predetermined nominal value,
provide the diagnostic signal voltage to the common guard node,
select one of the paired sense electrode and corresponding guard electrode to be diagnosed,
electrically connect the selected sense electrode to the common sense node and disconnect all other sense electrodes from the common sense node,
measure, by the current-to-voltage converter, an electric current value through the sense electrode and the corresponding guard electrode or common guard electrode that are to be diagnosed,
compare the measured electric current value with at least one predetermined nominal value, and
generate an output signal that is indicative of a hardware fault if the measured electric current value is different from the predetermined threshold value outside predefined tolerance margins.

The benefits described in context with the capacitance measurement circuit disclosed herein and the multi-channel capacitance sensing device disclosed herein apply to the proposed operating method to the full extent.

Preferably, the steps from selecting to generating an output signal are executed and repeated after swapping, for each cycle of these steps, to a next paired sense electrode and corresponding guard electrode of the plurality of sense electrodes paired with at least one corresponding guard electrode or common guard electrode that is to be diagnosed until all paired sense electrodes and corresponding guard electrodes have been diagnosed.

In this way, hardware faults such as broken electrical connections can reliably be detected and reported. The integrity of capacitive sensors of the multi-channel capacitive sensing device can effectively be monitored, and a reliable performance of the multi-channel capacitive sensing device within predefined specifications can be ensured.

Preferably, the steps from selecting to generating an output signal are repeated in a periodic manner. A period can be selected such that a functional availability of the multi-channel capacitive sensing device is virtually not affected.

In a further aspect of the invention, a software module for controlling an automatic execution of steps of a possible embodiment of the method disclosed herein is provided.

The method steps to be conducted are converted into a program code of the software module, wherein the program code is implementable in a non-transitory computer-readable medium such as a digital memory unit of the multi-channel capacitive sensing device and is executable by a processor unit of the multi-channel capacitive sensing device. Preferably, the digital memory unit and/or processor unit may be a digital memory unit and/or a processing unit of the electronic control unit of the multi-channel capacitive sensing device. The processor unit may, alternatively or supplementary, be another processor unit that is especially assigned to execute at least some of the method steps.

The software module can enable a robust and reliable execution of the method and can allow for a fast modification of method steps.

These and other aspects of the invention will be apparent from and elucidated with reference to the embodiments described hereinafter.

It shall be pointed out that the features and measures detailed individually in the preceding description can be combined with one another in any technically meaningful manner and show further embodiments of the invention. The description characterizes and specifies an embodiment of the invention in particular in connection with the figures.

BRIEF DESCRIPTION OF THE DRAWINGS

Further details and advantages of the present invention will be apparent from the following detailed description of not limiting embodiments with reference to the attached drawing, wherein.

DETAILED DESCRIPTION

Figure 1:
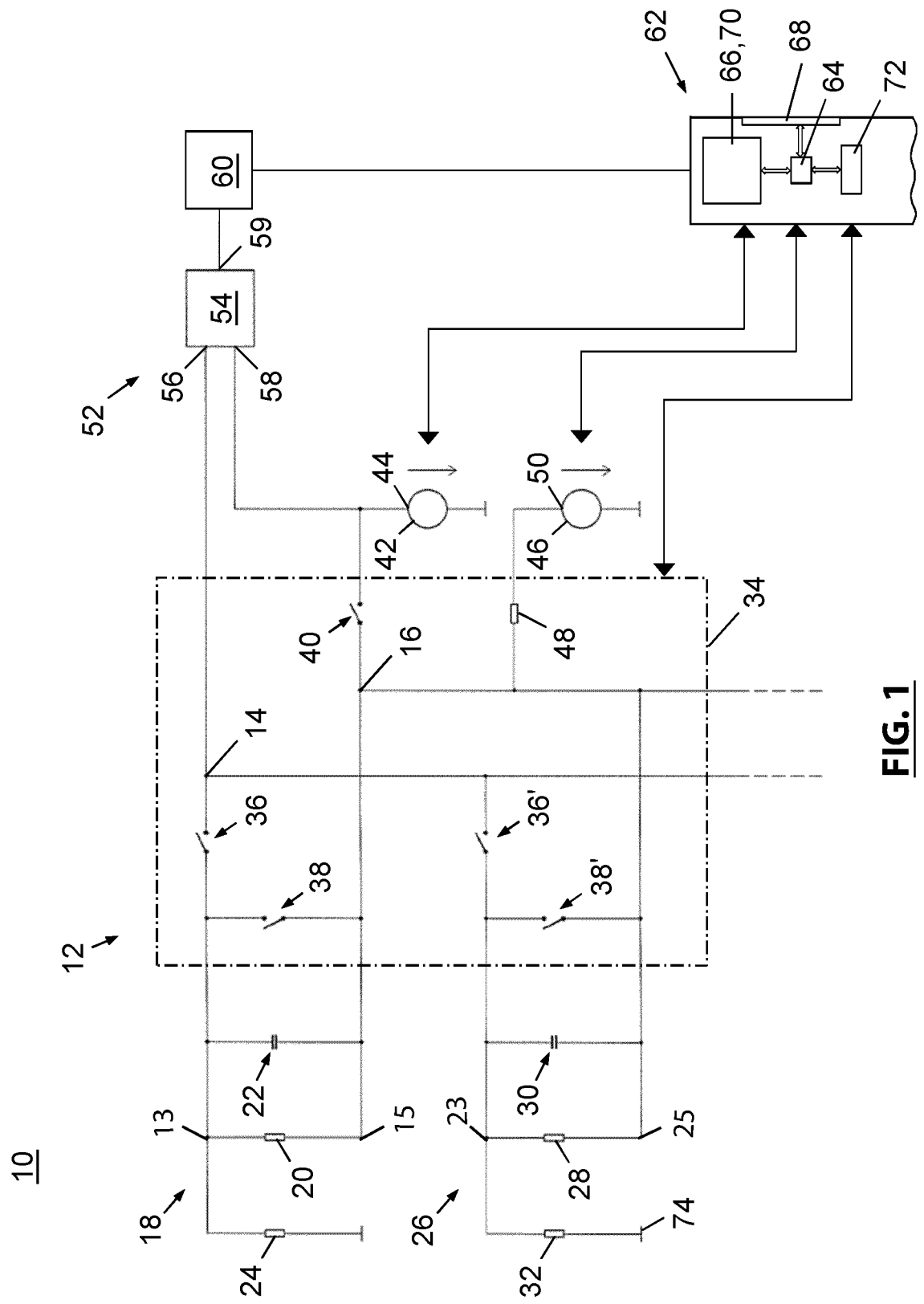
FIG. 1 illustrates an electric equivalent circuit diagram of a possible embodiment of a multi-channel capacitive sensing device employing a capacitance measurement circuit in accordance with the invention.

FIG. 1 schematically illustrates an electric equivalent circuit diagram of a possible embodiment of a multi-channel capacitive sensing device 10 employing a capacitance measurement circuit 12 in accordance with an embodiment of the invention. The capacitance measurement circuit 12 serves for determining complex electric currents in the multi-channel capacitive sensing device 10, which includes a plurality of electrically conductive sense electrodes and a plurality of electrically conductive guard electrodes or a common guard electrode. Each sense electrode can be paired with at least one corresponding electrically conductive guard electrode to constitute a capacitive sensor to be operated in loading mode. Each sense electrode and its corresponding guard electrode are arranged close to each other, and are mutually galvanically separated from each other. It will be appreciated that the electrically conductive guard electrodes with which the sense electrodes are paired may be dedicated guard electrodes for the sense electrodes, i.e. one separate guard electrode for each sense electrode, or a common guard electrode for several sense electrodes. In the latter case, the electrically conductive guard electrode of a plurality of sense electrodes is formed by a common electrically conductive guard electrode.

The capacitance measurement circuit 12 comprises a first sensing circuit 18 for selectively electrically connecting one of the sense electrodes 13 to a common sense node 14 and for electrically connecting a guard electrode 15 corresponding to the sense electrode to a common guard node 16. Thus, a sense-to-guard impedance 20, which is substantially of capacitive nature, is electrically connected between the common sense node 14 and the common guard node 16. The first sensing circuit 18 includes a capacitor 22 for EMC protection that is electrically connected between the sense electrode and the corresponding guard electrode.

The capacitance measurement circuit 12 comprises a second sensing circuit 26 for selectively electrically connecting another one of the sense electrodes 23 to the common sense node 14 and for electrically connecting a guard electrode 25 corresponding to the sense electrode to the common guard node 16. Thus, a sense-to-guard impedance 28, which is substantially of capacitive nature, is electrically connected between the common sense node 14 and the common guard node 16. The second sensing circuit 26 includes a capacitor 30 for EMC protection that is electrically connected between the sense electrode and the corresponding guard electrode.

As indicated by dashed lines in FIG. 1, the capacitance measurement circuit 12 includes further sensing circuits, which are identically designed to the first sensing circuit 18 and the second sensing circuit 26, for selectively electrically connecting the remainder of the sense electrodes of the plurality of sense electrodes, and for electrically connecting the remainder of the corresponding guard electrodes of the plurality of guard electrodes. For instance, the capacitance measurement circuit 12 may include between two and fifty sensing circuits.

The capacitance measurement circuit 12 further includes a measurement signal voltage source 42 that is configured for providing an alternating measurement voltage at an output port 44. The measurement voltage may have a sinusoidal shape. The measurement signal voltage source 42 has a remotely controllable signal output level. The common guard node 16 is selectively electrically connectable to the output port 44 of the measurement signal voltage source 42 for receiving the measurement voltage via a remotely controllable switching member 40. As will be discussed in more detail later, the switching member 40 can be controlled into a closed state for regular measurement purposes, and can be controlled into an open state for diagnostic purposes.

Moreover, the capacitance measurement circuit 12 comprises a diagnostics signal voltage source 46 that is configured for providing an alternating diagnostic voltage at an output port 50. The diagnostic voltage may have a sinusoidal shape. The diagnostic signal voltage source 46 has a remotely controllable signal output level. The common guard node 16 is electrically connected to the output port 50 of the diagnostic signal voltage source 46 for receiving the diagnostic voltage via an electric member 48, which can be designed either as a known impedance or as a remotely controllable switching member.

The capacitance measurement circuit 12 includes a current measurement circuit 52 that comprises a measurement current-to-voltage converter 54. The measurement current-to-voltage converter 54 comprises a transimpedance amplifier (TIA) that is connected with its signal input port 56 to the common sense node 14 and with its reference input port 58 to the output port 44 of the measurement signal voltage source 42. The function of the TIA is to convert a complex electric current provided at its signal input port 56 into an output voltage that is proportional to the determined complex electric current. The TIA is configured to convert the complex electric current provided at its signal input port 56 with reference to a reference voltage that is provided to its reference input port 58, namely the measurement voltage.

Thus, the measurement current-to-voltage converter 54 is configured to determine, with reference to the measurement voltage, a measurement current through one of the sense electrodes that is indicative of a position of an object relative to a capacitive sensor that is constituted by the respective sense electrode and its corresponding guard electrode. An object approaching the respective sense electrode is represented in the electric equivalent circuit diagram of FIG. 1 by an unknown impedance 24, 32 that is connected to AC ground potential 74, which for instance may be a vehicle ground potential. If the grounded object approaches the respective sense electrode, the unknown impedance 24, 32 changes in that at least its capacitive portion increases, and the measurement current flowing between the respective sense electrode and ground potential and, by that, an amplitude of the TIA output voltage signal is increased, usually indicating a closer proximity of the object to the respective sense electrode.

Furthermore, the capacitance measurement circuit 12 includes a switching unit 34 that is remotely controllable by a remote control unit 72. The remotely controllable switching unit 34 comprises a plurality of operatively coupled switching members 36, 36' forming a first group. One of the switching members 36, 36' of the first group is installed, connected in series, in each of the sensing circuits 18, 26 for selectively electrically connecting the sense electrodes to the common sense node 14. The switching members 36, 36' are operatively coupled in that if one switching member 36 is controlled to change its switching position from open to closed, the other switching members 36' are controlled to change their switching position from closed to open or are controlled to remain in the open switching position, respectively. In this way, only one sense electrode of the plurality of sense electrodes is electrically connected to the common sense node 14 at a particular time.

The remotely controllable switching unit 34 comprises another plurality of operatively coupled switching members 38 forming a second group. One of the switching members 38, 38' of the second group is installed in each of the sensing circuits 18, 26 for selectively electrically connecting or disconnecting the respective sense electrodes and its corresponding guard electrode. The switching members 38, 38' of the second group are operatively coupled in that if one switching member 38 is controlled to change its switching position from closed to open, the other switching members 38' are controlled to change their switching position from open to closed or are controlled to remain in the closed switching position, respectively. The switching members 38, 38' of the second group provide a low shunt impedance between a sense electrode that is not used for measurement, and the common guard node 16 for reducing a systematic measurement error due to non-zero capacitance of wiring and/or switching members 36, 36' of the first group, which may be formed by transistors such as MOSFETs, in a closed position.

The remotely controllable switching unit 34 is configured to be controlled to periodically switch, for each sense electrode of the plurality of electrically conductive sense electrodes, and in a manner that is coordinated among the plurality of electrically conductive sense electrodes, between a measurement switching state and a diagnostic switching state of the respective sense electrode.

The multi-channel capacitive sensing device 10 further includes a signal processing circuit 60 that is configured for receiving and further processing of output signals from the current measurement circuit 52, and, more specifically, from the current-to-voltage converter 54. The signal processing circuit 60 may comprise a synchronous rectifier and a lowpass filter, and is inserted between an output port 59 of the current-to-voltage converter 54 and an electronic control unit 62 that also forms part of the multi-channel capacitive sensing device 10.

The electronic control unit 62 is configured to automatically control the measurement voltage level of the measurement signal voltage source 42, the diagnostic voltage level of the diagnostic signal voltage source 46, and the remotely controllable switching unit 34, i.e. the selective electrical connections of the sensing circuits 18, 26.

The electronic control unit 62 is formed by a microcontroller, and the remote control unit 72 for remotely controlling switching unit 34, the measurement signal voltage source 42 and the diagnostic signal voltage source 46 forms part of the microcontroller. The microcontroller includes a digital data memory unit 66, a processor unit 64 with data access to the digital data memory unit 66 and a control interface 68 designed as a CAN interface.

It is noted that AC coupling capacitors or impedances for limiting electric currents during a potential sensor short circuit to any external nodes or in case of an ESD (electrostatic discharge) event can be inserted in series with most of the members of the capacitance measurement circuit 12.

In a loading measurement state with regard to a capacitive sensor constituted by one of the sense electrodes and its corresponding electrode that are connected with one of the sensing circuits 18, 26, the switching unit 34 is configured to electrically connect the respective sense electrode to the signal input port 56 of the measurement current-to-voltage converter 54 by controlling the switching member 36 of the first group within the respective sensing circuit 18 into a closed switching state. At the same time, all other switching members 36' of the first group within the other sensing circuits 26 are controlled into an open switching state.

The switching member 38 of the second group within the respective sensing circuit 18 is controlled into an open switching state, and all other switching members 38' of the second group within the other sensing circuits 26 are controlled into a closed switching state. Further, the remotely controllable switching member 40 between the output port 44 of the measurement signal voltage source 42 and the common guard node 16 is controlled into a closed state such that the measurement signal voltage source 42 can provide the measurement voltage to the common guard node 16.

Also, if the electric member 48 connected between the common guard node 16 and the output port 50 of the diagnostic signal voltage source 46 is a switching member, the switching member is controlled into an open switching state. If the electric member is a known impedance, the signal output level of the diagnostic signal voltage source 46 is controlled to zero level.

The measurement current-to-voltage converter 54 measures the unknown current flowing through the unknown impedance 24. The voltage at the output port 59 of the measurement current-to-voltage converter 54 is further processed by the signal processing circuit 60, whose output signal is indicative of the unknown impedance 24 and can be measured, recorded and evaluated.

In a diagnostic state with regard to a capacitive sensor constituted by one of the sense electrodes and its corresponding electrode that are connected with one of the sensing circuits 18, the switching unit 34 is configured to electrically connect the respective sense electrode to the signal input port 56 of the measurement current-to-voltage converter 54 by controlling the switching member 36 of the first group within the respective sensing circuit 18 into a closed switching state. At the same time, all other switching members 36' of the first group within the other sensing circuits 26 are controlled into an open switching state.

The switching member 38 of the second group within the respective sensing circuit 18 is controlled into an open switching state. Further, the remotely controllable switching member 40 between the output port 44 of the measurement signal voltage source 42 and the common guard node 16 is controlled into an open state, and the measurement voltage level of the measurement signal voltage source 42 is controlled to zero level.

Also, if the electric member 48 connected between the common guard node 16 and the output port 50 of the diagnostic signal voltage source 46 is a switching member, the switching member is controlled into a closed switching state, and the signal output level of the diagnostic signal voltage source 46 is controlled to nominal non-zero level. If the electric member is a known impedance, the signal output level of the diagnostic signal voltage source 46 is just controlled to a nominal non-zero level.

In the diagnostic state, the measurement current-to-voltage converter 54 is measuring a complex electric current flowing from the diagnostic signal voltage source through the common guard node 16 into the first sensing circuit 18, through the sense-to-guard impedance 20, the switching member 36 of the first group and the common sense node 14, and into the signal input port 56 of the measurement current-to-voltage converter 54. The voltage at the output port 59 of the measurement current-to-voltage converter 54 is further processed by the signal processing circuit 60, whose output signal is indicative of the sense-to-guard impedance 20 and can be measured, recorded and evaluated.

As the voltage level of the diagnostic signal voltage source 46 is known a priori, and the impedance of the electric member 48 is known a priori, if it is designed as an impedance, the sense-to-guard impedance 20 can be calculated. As the reference input port 58 of the measurement current-to-voltage converter 54 is connected to AC ground potential 74 by the output port 44 of the measurement signal voltage source 42, the common sense node 14 is also at AC ground potential 74, since the measurement current-to-voltage converter 54 maintains voltages at its signal input port 56 and its reference input port 58 at virtually the same voltage level.

Furnished with the electronic control unit 62, the multi-channel capacitance sensing device 10 is configured to generate an output signal that is indicative of a hardware fault such as a sensor electrode interruption if the magnitude of a determined diagnostic current flowing through the respective sense electrode and its corresponding guard electrode is different from a predetermined threshold value outside predefined tolerance margins.

In the following, an embodiment of a method of operating the multi-channel capacitive sensing device 10 pursuant to FIG. 1 for diagnosis of sense electrodes being paired with corresponding guard electrodes will be described. A flowchart of the method is provided in FIG. 2. In preparation of operating the multi-channel capacitive sensing device 10, it shall be understood that all involved units and devices are in an operational state and in general configured as illustrated in FIG. 1.

In order to be able to carry out the method automatically and in a controlled way, the electronic control unit 62 comprises a software module 70 (FIG. 1). The method steps to be conducted are converted into a program code of the software module 70. The program code is implemented in the digital data memory unit 66 of the electronic control unit 62 and is executable by the processor unit 64 of the electronic control unit 62.

All predetermined/predefined values, threshold values and tolerance margins mentioned herein may reside in the digital data memory unit 66 of the electronic control unit 62 and can readily be retrieved by the processor unit 64 of the electronic control unit 62.

Figure 2:
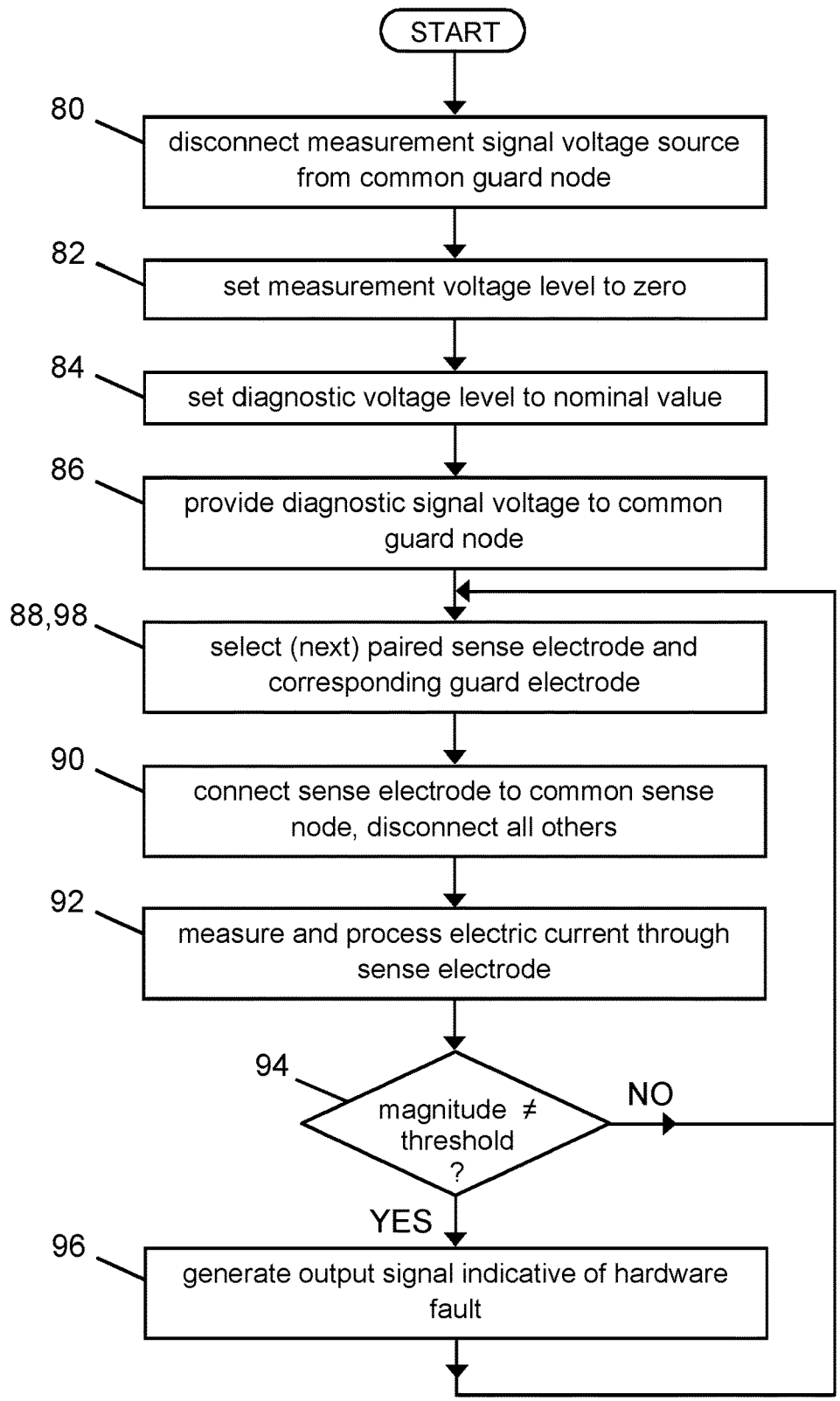
FIG. 2 is a flow chart of a method of operating the operating the multi-channel capacitive sensing device pursuant to FIG. 1 for diagnosis of the sense electrodes that are paired with corresponding guard electrodes.

Referring now to FIG. 2, in a first step 80 of the method the output port 44 of the measurement signal voltage source 42 is electrically disconnected from the common guard node 16 by controlling the remotely controllable switching member 40 into an open switching state. By operating the electronic control unit 62, the measurement signal voltage source 42 is controlled to set the measurement voltage level to zero in another step 82. In the next step 84, by operating the electronic control unit 62, the diagnostic signal voltage source 46 is controlled to set the diagnostic voltage level to a predetermined nominal value. Then, in another step 86, the diagnostic signal voltage is provided to the common guard node 16, for instance by controlling the switching member into a closed switching state if the electric member 48 is designed as a switching member.

In the next step 88, one of the paired sense electrode and corresponding guard electrode to be diagnosed is selected. The selected sense electrode is electrically connected to the common sense node 14 and all other sense electrodes are disconnected from the common sense node 14 in a next step 90 by controlling the switching members 36, 36' of the first group. In another step 92, an electric current value through the sense electrode and the corresponding guard electrode that are to be diagnosed is measured by the current-to-voltage converter 54 and is further processed by the signal processing circuit 60. By operating the electronic control unit 62, the measured and processed electric current value is compared with the predetermined threshold value in the next method step 94. If a magnitude of the measured electric current value is different from the predetermined nominal value outside predefined tolerance margins, an output signal is generated by the electronic control unit 62 in another step 96 that is indicative of a hardware fault within the diagnosed sensing circuit 18, 26, i.e. within the electric connections and wiring of the selected sense electrode and the corresponding guard electrode. The output signal may then be recorded and/or reported to a higher-rank control unit for further action.

In another step 98 of the method, a next paired sense electrode and corresponding guard electrode of the plurality of sense electrodes paired with a corresponding guard electrode that is to be diagnosed is selected. The aforementioned cycle of steps is carried out for diagnosing the integrity of a next selected next paired sense electrode and corresponding guard electrode until all paired sense electrodes and corresponding guard electrodes have been diagnosed.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality, which is meant to express a quantity of at least two. The mere fact that certain measures are recited in mutually different dependent claims does not indicate that a combination of these measures cannot be used to advantage. Any reference signs in the claims should not be construed as limiting scope.

The invention claimed is:

1. A capacitance measurement circuit for determining complex electric currents in a multi-channel capacitive sensing device that includes a plurality of electrically conductive sense electrodes, each sense electrode being paired with at least one corresponding electrically conductive guard electrode, the capacitance measurement circuit comprising:
a first sensing circuit for selectively electrically connecting one of the sense electrodes to a common sense node and for electrically connecting the corresponding guard electrode of the sense electrode to a common guard node,
at least a second sensing circuit for selectively electrically connecting another one of the sense electrodes to the common sense node and for electrically connecting the corresponding guard electrode of the sense electrode to the common guard node,
a measurement signal voltage source that is configured for providing an alternating measurement voltage at an output port to the common guard node in a remotely controllable manner,
a diagnostic signal voltage source that is configured for providing an alternating diagnostic voltage at an output port to the common guard node in a remotely controllable manner, and
a current measurement circuit including at least one measurement current-to-voltage converter that is connected with its signal input port to the common sense node and with its reference input port to the output port of the measurement signal voltage source.

2. The capacitance measurement circuit as claimed in claim 1, further including a remotely controllable switching unit comprising a plurality of operatively coupled switching members, at least one of which is installed, connected in series, in each of the sensing circuits for selectively electrically connecting the sense electrodes to the common sense node.

3. The capacitance measurement circuit as claimed in claim 2, wherein the remotely controllable switching unit is configured to periodically switch, for each sense electrode of the plurality of electrically conductive sense electrodes, and in a manner that is coordinated among the plurality of electrically conductive sense electrodes, between a measurement switching state and a diagnostic switching state of the respective sense electrode.

4. The capacitance measurement circuit as claimed in claim 1, wherein at least one out of the output port of the measurement signal voltage source and the output port of the diagnostic signal voltage source has a remotely controllable signal output level.

5. The capacitance measurement circuit as claimed in claim 1, wherein a known complex impedance or a remotely controllable switching member is connected between the output port of the diagnostic signal voltage source and the common guard node for remotely controlling a provision of the diagnostic voltage to the common guard node.

6. The capacitance measurement circuit as claimed in claim 1, wherein the at least one measurement current-to-voltage converter comprises a transimpedance amplifier.

7. The capacitance measurement circuit as claimed in claim 1, wherein electrically conductive guard electrodes of a plurality of sense electrodes are connected to form a common electrically conductive guard electrode.

8. The capacitance measurement circuit as claimed in claim 1, wherein each one of the sensing circuits comprises a remotely controllable switching member that is configured to selectively electrically connect or disconnect the respective sense electrode.

9. A multi-channel capacitive sensing device comprising:
    a capacitance measurement circuit as claimed in claim 1,
    a plurality of electrically conductive sense electrodes, each sense electrode being paired with at least one corresponding electrically conductive guard electrode, wherein each one of the sense electrodes and its at least one corresponding guard electrode are connected to one of the sensing circuits of the capacitance measurement circuit for selectively electrically connecting the sense electrode to the common sense node and for electrically connecting the at least one corresponding guard electrode to the common guard node,
    a signal processing circuit that is configured for receiving and further processing of output signals from the current measurement circuit, and
    an electronic control unit that is at least configured to automatically control the measurement voltage level of the measurement signal voltage source, the diagnostic voltage level of the diagnostic signal voltage source, and the selective electrical connections of the sensing circuits.

10. The multi-channel capacitive sensing device as claimed in claim 9, wherein the electronic control unit is formed by a microcontroller that includes a digital data memory unit and a processor unit with data access to the digital data memory unit.

11. The multi-channel capacitive sensing device as claimed in claim 9, wherein the remotely controllable switching unit forms part of the electronic control unit.

12. The multi-channel capacitive sensing device as claimed in claim 9, wherein the signal processing circuit or the electronic control unit is configured to generate an output signal that is indicative of a hardware fault if the magnitude of a determined diagnostic current flowing through one of the sense electrodes and the corresponding guard electrode is different from a predetermined nominal value outside predefined tolerance margins.

13. A method of operating the multi-channel capacitive sensing device as claimed in claim 9 for diagnosis of sense electrodes being paired with corresponding guard electrodes or a common guard electrode, the method comprising at least the following steps:
    electrically disconnect (80) the output port of measurement signal voltage source from the common guard node,
    control (82) the measurement signal voltage source to set a measurement voltage level to zero,
    control (84) the diagnostic signal voltage source to set a diagnostic voltage level to a predetermined nominal value,
    provide (86) the diagnostic signal voltage to the common guard node,
    select (88) one of the paired sense electrode and corresponding guard electrode or common guard electrode to be diagnosed,
    electrically connect (90) the selected sense electrode to the common sense node and disconnect all other sense electrodes from the common sense node,
    measure (92), by the current-to-voltage converter, an electric current value through the sense electrode and the corresponding guard electrode that are to be diagnosed,
    compare (94) the measured electric current value with at least one predetermined nominal value, and
    generate (96) an output signal that is indicative of a hardware fault if a magnitude of the measured electric current value is different from the predetermined nominal value outside predefined tolerance margins.

14. The method as claimed in claim 13, wherein the steps from selecting (88) to generating (96) an output signal are executed and repeated after swapping, for each cycle of these steps (88) to (96), to a next sense electrode of the plurality of sense electrodes paired with at least one corresponding guard electrode or a common guard electrode that is to be diagnosed until all paired sense electrodes and corresponding guard electrodes or common guard electrode have been diagnosed.

15. A non-transitory computer-readable medium for controlling an automatic execution of steps of the method as claimed in claim 13, wherein the method steps are stored on the computer-readable medium as program code that is executable by a processor unit of the multi-channel capacitive sensing device or of a separate electronic control unit.

* * * * *